United States Patent
Choo et al.

(10) Patent No.: US 10,352,997 B2
(45) Date of Patent: *Jul. 16, 2019

(54) METHOD OF MEASURING CLOCK JITTER, CLOCK JITTER MEASUREMENT CIRCUIT, AND SEMICONDUCTOR DEVICE INCLUDING THE SAME

(71) Applicant: SAMSUNG ELECTRONICS CO., LTD., Suwon-si, Gyeonggi-Do (KR)

(72) Inventors: Kang-Yeop Choo, Seoul (KR); Hyun-Ik Kim, Incheon (KR); Won-Seok Kim, Suwon-si (KR); Jung-Ho Kim, Seoul (KR); Ji-Hyun Kim, Hwaseong-si (KR); Tae-Ik Kim, Seongnam-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/053,429

(22) Filed: Aug. 2, 2018

(65) Prior Publication Data

US 2019/0041456 A1 Feb. 7, 2019

(30) Foreign Application Priority Data

Aug. 3, 2017 (KR) .................. 10-2017-0098523
Nov. 21, 2017 (KR) .................. 10-2017-0155811

(51) Int. Cl.
*G01R 31/317* (2006.01)
(52) U.S. Cl.
CPC . *G01R 31/31709* (2013.01); *G01R 31/31726* (2013.01); *G01R 31/31727* (2013.01)

(58) Field of Classification Search
CPC .... G01R 31/31709; G01R 29/26; H04L 1/205
USPC ........................................ 375/371
See application file for complete search history.

(56) References Cited

U.S. PATENT DOCUMENTS

| 7,120,215 B2 | 10/2006 | Li et al. |
| 7,684,533 B2 | 3/2010 | Eckhardt et al. |
| 7,688,242 B2 | 3/2010 | Shimizu et al. |
| 7,945,404 B2 | 5/2011 | Ho et al. |

(Continued)

FOREIGN PATENT DOCUMENTS

| CN | 107589367 A | 1/2018 |
| KR | 1020180006227 | 1/2018 |

*Primary Examiner* — Kevin Kim
(74) *Attorney, Agent, or Firm* — Volentine, Whitt & Francos, PLLC

(57) ABSTRACT

A clock jitter measurement circuit includes: an internal signal generator configured to generate a single pulse signal and an internal clock signal which are both synchronized with an input clock signal received by the clock jitter measurement circuit, a plurality of edge delay cells serially connected to each other and configured to generate a plurality of edge detection signals respectively corresponding to a plurality of delay edges obtained by delaying an edge of the internal clock signal, a plurality of latch circuits configured to latch the single pulse signal in synchronization with the plurality of edge detection signals and output a plurality of sample signals, and a count sub-circuit configured to count a number of activated sample signals of the plurality of sample signals and output a count value based on the counted number of activated sample signals.

20 Claims, 15 Drawing Sheets

(56) References Cited

U.S. PATENT DOCUMENTS

| | | |
|---|---|---|
| 7,957,923 B2 | 6/2011 | Chao et al. |
| 8,144,756 B2 | 3/2012 | Lee et al. |
| 9,118,308 B1* | 8/2015 | Lee .................. H03K 5/1565 |
| 2006/0132340 A1 | 6/2006 | Lin |
| 2008/0219380 A1* | 9/2008 | Payne ................ H04L 7/0008 375/308 |
| 2014/0266369 A1* | 9/2014 | Brunolli ............. H03K 3/0375 327/211 |
| 2015/0326211 A1* | 11/2015 | Hoshino ............... H02P 27/08 318/503 |
| 2018/0011142 A1 | 1/2018 | Choo et al. |

\* cited by examiner

US 10,352,997 B2

METHOD OF MEASURING CLOCK JITTER, CLOCK JITTER MEASUREMENT CIRCUIT, AND SEMICONDUCTOR DEVICE INCLUDING THE SAME

CROSS-REFERENCES TO RELATED APPLICATIONS

This application claims the benefit of Korean Patent Application Nos. 10-2017-0098523, filed on Aug. 3, 2017 and 10-2017-0155811, filed on Nov. 21, 2017, in the Korean Intellectual Property Office, the disclosures of which are incorporated herein in their entirety by reference.

BACKGROUND

The inventive concept relates to jitter of a clock signal, and more particularly, to a circuit and method of measuring clock jitter.

Digital circuits may operate in synchronization with a clock signal. For example, the digital circuits may each include a plurality of flip-flops, and each of the plurality of flip-flops may operate in response to an edge of the clock signal. Also, function blocks which operate in synchronization with the clock signal may have different operating frequencies, and thus, a plurality of clock signals having various frequencies may be generated.

A clock signal is intended to be periodical, but due to various factors, in general the clock signal will deviate from true periodicity, and this deviation is referred to as "jitter", or more specifically in the case of a clock signal as "clock jitter." Due to a design which is made by a designer in consideration of an amount of jitter in a clock signal, the performance of a function block is limited by the jitter of the clock signal. The amount of jitter in the clock signal may vary among dies, or within a die, due to variations of a semiconductor manufacturing process, and may vary with a temperature of a digital circuit or a voltage applied to the digital circuit. The amount of jitter may be determined based on the performance of a circuit (for example, a phase locked loop (PLL)) which generates the clock signal.

SUMMARY

The inventive concept provides a clock jitter measurement circuit for measuring a clock jitter, a semiconductor device including the same, and a clock jitter measurement method.

According to an aspect of the inventive concept, there is provided a clock jitter measurement circuit including: an internal signal generator configured to generate a single pulse signal and an internal clock signal which are both synchronized with an input clock signal which is received by the internal signal generator; a plurality of edge delay cells configured to generate a plurality of edge detection signals respectively corresponding to a plurality of delay edges obtained by delaying an edge of the internal clock signal, the plurality of edge delay cells being serially connected to each other; a plurality of latch circuits configured to latch the single pulse signal in synchronization with the plurality of edge detection signals and thereby output a plurality of sample signals; and a count sub-circuit configured to count a number of activated sample signals of the plurality of sample signals and output a count value based on the counted number of activated sample signals.

According to another aspect of the inventive concept, there is provided a semiconductor device including: a function block including a logic circuit configured to receive an input clock signal and to operate in synchronization with the input clock signal; a clock jitter measurement circuit configured to measure a jitter of the input clock signal, based on a value obtained by counting a plurality of delay edges during a single pulse synchronized with the input clock signal, the plurality of delay edges being obtained by delaying an edge of the input clock signal; and a performance control circuit configured to control performance of the logic circuit, based on the measured jitter of the input clock signal.

According to another aspect of the inventive concept, there is provided a clock jitter measurement method including: generating an internal clock signal synchronized with an input clock signal; generating a plurality of edge detection signals respectively corresponding to a plurality of delay edges obtained by delaying an edge of the internal clock signal; generating a single pulse signal synchronized with the input clock signal, latching the single pulse signal in synchronization with the plurality of edge detection signals to generate a plurality of sample signals; and counting a number of activated sample signals of the plurality of sample signals to generate a count value based on the counted number of activated sample signals.

According to yet another aspect of the inventive concept, a method comprises: generating a plurality of edge detection signals from an input clock signal, wherein the edge detection signals each detect an edge in an internal clock signal, which is synchronized to the input clock signal, at a corresponding point delayed in time with respect to the edge in the internal clock signal; counting a number of the plurality of edge detection signals which exhibit a transition within a defined time interval which is proportional to a period of the input clock signal; and estimating a jitter in the input clock signal from a result of the counting

BRIEF DESCRIPTION OF THE DRAWINGS

Embodiments of the inventive concept will be more clearly understood from the following detailed description taken in conjunction with the accompanying drawings.

DETAILED DESCRIPTION OF THE EMBODIMENTS

Figure 1:
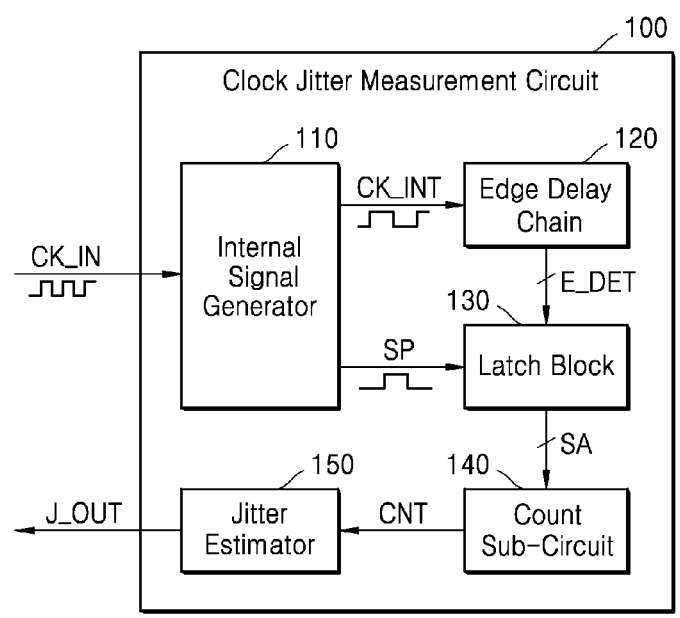
FIG. 1 is an example embodiment of a block diagram of a clock jitter measurement circuit.
Figure 2:
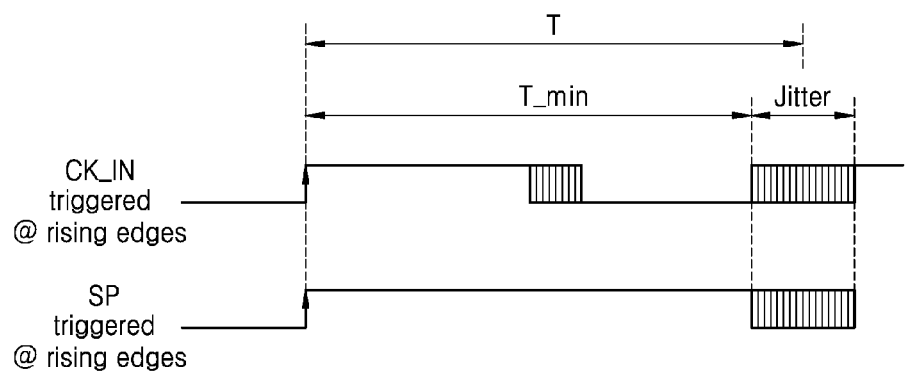
FIG. 2 is a timing diagram of an input clock signal and a single pulse signal of FIG. 1, according to an example embodiment.

FIG. 1 is a block diagram of an example embodiment of a clock jitter measurement circuit 100, and FIG. 2 is a timing diagram of an input clock signal CK_IN and a single pulse signal SP of FIG. 1 according to an example embodiment. Clock jitter measurement circuit 100 of FIG. 1 may be manufactured by a semiconductor process and may be included in a semiconductor device. As illustrated in FIG. 1, clock jitter measurement circuit 100 may receive the input clock signal CK_IN and may measure a jitter of the input clock signal CK_IN to generate a jitter output signal J_OUT.

Referring to FIG. 2, the input clock signal CK_IN may be generated to have an ideal period "T", but a circuit (for example, a logic circuit) included in a function block receiving the input clock signal CK_IN may experience a deviation of the period of the input clock signal CK_IN from its ideal value "T" caused by various factors. A function block included in a semiconductor device may include one or more circuits for driving the semiconductor device. As shown in FIG. 2, when the input clock signal CK_IN is triggered at a rising edge, a jitter of the input clock signal CK_IN is presented as an area where subsequent rising edges overlap each other. A jitter of the input clock signal CK_IN may limit the performance of a function block which operates in synchronization with the input clock signal CK_IN. For example, a delay time of a critical path of a function block receiving the input clock signal CK_IN may be less than "T_min" which is shorter than the period "T".

The jitter of the input clock signal CK_IN may vary due to various causes. For example, the input clock signal CK_IN may vary due to a variation of a process voltage and temperature (PVT). That is, despite circuits which are identically designed and manufactured, jitters of different input clock signals CK_IN may occur in dies due to a deviation of a semiconductor manufacturing process, jitters of different input clock signals CK_IN may occur even in the same die, and the jitter of the input clock signal CK_IN may increase or decrease due to a temperature of a digital circuit and/or a voltage applied to the digital circuit. In designing an integrated circuit, a designer may set a high margin for the input clock signal CK_IN in consideration of a variation of the jitter of the input clock signal CK_IN, and for this reason, the performance of the integrated circuit may be further limited.

Clock jitter measurement circuit 100, as described below, may use a unidirectional edge (for example, a rising edge or a falling edge) of the input clock signal CK_IN, and thus, may accurately measure a period of the input clock signal CK_IN and may provide a jitter measurement with high accuracy. Due to the accurately measured jitter and/or period of the input clock signal CK_IN, the performance of a function block and the performance of the digital circuit including the function block may be improved or optimized. Also, as described below, clock jitter measurement circuit 100 may not include an analog circuit such as an amplifier, and thus, may be implemented by a digital synthesis, whereby clock jitter measurement circuit 100 may be implemented with standard cells included in a standard cell library. As a result, clock jitter measurement circuit 100 is easy to implement along with other function blocks of the digital circuit and may be extensively applied to various applications. Also, clock jitter measurement circuit 100 is insensitive to a variation of the PVT caused by a below-described structural feature, and thus, without compensating for the variation of the PVT, the jitter of the input clock signal CK_IN is accurately measured.

Referring to FIG. 1, clock jitter measurement circuit 100 may include an internal signal generator 110, an edge delay chain 120, a latch block 130, a count sub-circuit 140, and a jitter estimator 150. Internal signal generator 110 may receive the input clock signal CK_IN to generate an internal clock signal CK_INT and the single pulse signal SP. The internal clock signal CK_INT and the single pule signal SP generated by internal signal generator 110 may be synchronized with the input clock signal CK_IN. For example, the internal clock signal CK_INT may be obtained by dividing the frequency of the input clock signal CK_IN, and the single pulse signal SP may be activated or deactivated in synchronization with an edge of the input clock signal CK_IN. For example, as shown in FIG. 2, in order to measure the period of the input clock signal CK_IN, internal signal generator 110 may generate the single pulse signal SP having an active pulse width which is the same as the period of the input clock signal CK_IN.

Edge delay chain 120 may receive the internal clock signal CK_INT from internal signal generator 110 to generate a plurality of edge detection signals E_DET. The plurality of edge detection signals E_DET may correspond to a plurality of delay edges obtained through a plurality of delays of an edge of the internal clock signal CK_INT, and may have a certain active pulse width. Edge delay chain 120 may include a plurality of edge delay cells which are serially connected to each other, and the internal clock signal CK_INT may be input to a first edge delay cell of the plurality of edge delay cells. The plurality of edge detection signals E_DET may be respectively output from the plurality of edge delay cells. Hereinafter, for convenience of description, examples of edge delay chain 120 for delaying a rising edge of the internal clock signal CK_INT will be mainly described, but it may be understood that edge delay chain 120 may delay a falling edge of the internal clock signal CK_INT. An example of edge delay chain 120 will be described below with reference to FIG. 3.

Latch block 130 may receive the plurality of edge detection signals E_DET from edge delay chain 120, receive the single pulse signal SP from the internal signal generator 110, and generate a plurality of sample signals SA. Latch block 130 may include a plurality of latch circuits, and the plurality of latch circuits may latch the single pulse signal SP in synchronization with the respective edge detection signals E_DET. That is, each of the plurality of latch circuits may latch the single pulse signal SP in synchronization with one of the plurality of edge detection signals E_DET received thereby, and thus, may output an activated or deactivated signal as one of the sample signals SA. As a result, the number of the edge delay cells included in edge delay chain 120, the number of the latch circuits included in latch block 130, the number of signals included in the edge detection signals E_DET, and the number of signals included in the sample signals SA may be the same. Details of latch block 130 will be described below with reference to FIGS. 7 and 10.

Count sub-circuit 140 may receive the plurality of sample signals SA from latch block 130 to output a count signal CNT. Count sub-circuit 140 may count the number of activated sample signals of the plurality of sample signals SA to output the count signal CNT representing the number of the activated sample signals of the plurality of sample signals SA. For example, the number of the edge delay cells included in edge delay chain 120 may be $2^N$ (where N is an integer larger than one), and thus, the plurality of sample signals SA may include $2^N$ signals. Count sub-circuit 140 may count activated sample signals of the $2^N$ sample signals SA to generate the count signal CNT of N bits. A value represented by the count signal CNT output from count sub-circuit 140 may be proportional to an active pulse width of the single pulse signal SP and may be proportional to the period of the input clock signal CK_IN due to the single pulse signal SP synchronized with the input clock signal CK_IN. That is, the period of the input clock signal CK_IN may be measured from the count signal CNT.

Jitter estimator 150 may receive the count signal CNT from count sub-circuit 140 and may estimate the jitter of the input clock signal CK_IN, based on the count signal CNT, thereby generating the jitter output signal J_OUT. In some embodiments, jitter estimator 150 may estimate the jitter of the input clock signal CK_IN, based on the number of the edge delay cells included in edge delay chain 120 and the count signal CNT. For example, if the single pulse signal SP has an active pulse width matching the period (for example, T_I of FIG. 4) of the internal clock signal CK_INT, the count signal CNT may have a value matching the number of the edge delay cells included in edge delay chain 120. By using the count signal CNT, jitter estimator 150 may estimate the jitter of the input clock signal CK_IN to generate the jitter output signal J_OUT including information about the jitter. Examples of jitter estimator 150 will be described below with reference to FIGS. 14A and 14B, and internal signals of clock jitter measurement circuit 100 will be described below with reference to timing diagrams of FIGS. 4 and 8. In some embodiments, jitter estimator 150 may be provided outside clock jitter measurement circuit 100, and clock jitter measurement circuit 100 may output the count signal CNT to the outside of clock jitter measurement circuit 100.

Figure 3:
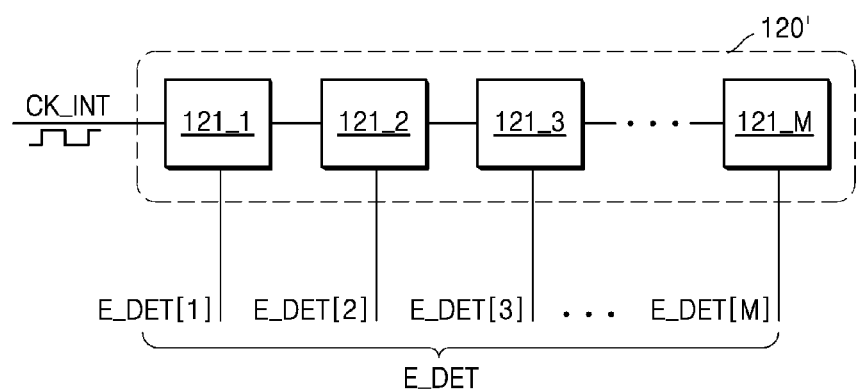
FIG. 3 is a block diagram illustrating an example embodiment of an edge delay chain of FIG. 1.
Figure 4:
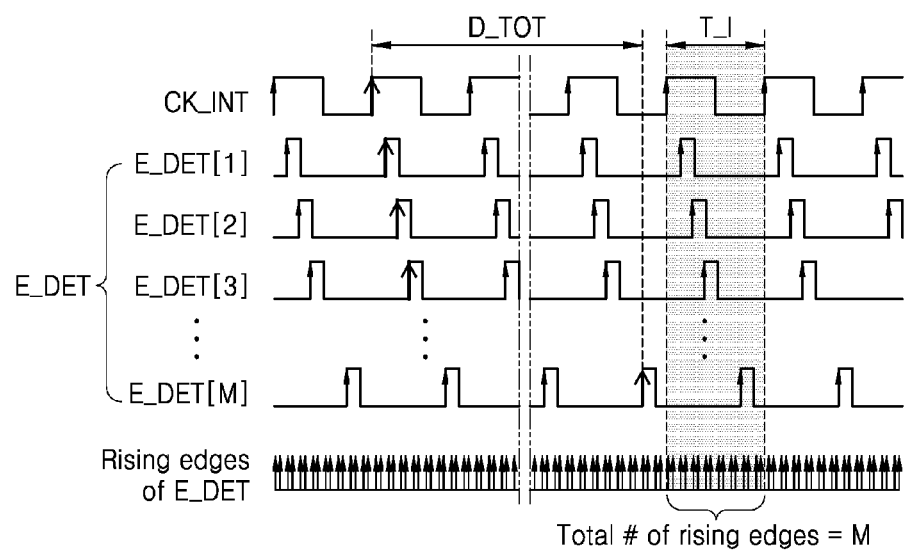
FIG. 4 is a timing diagram of edge detection signals output from the edge delay chain of FIG. 3, according to an example embodiment.

FIG. 3 is a block diagram illustrating an example embodiment of edge delay chain 120 of FIG. 1, and FIG. 4 is a timing diagram of edge detection signals E_DET output from an edge delay chain 120' of FIG. 3 according to an example embodiment. As described above with reference to FIG. 1, edge delay chain 120' of FIG. 3 may receive the internal clock signal CK_INT from internal signal generator 110 of FIG. 1 to provide the edge detection signals E_DET to latch block 130 of FIG. 1.

Referring to FIG. 3, edge delay chain 120' may include a number ("M") of edge delay cells 121_1 to 121_M (where M is an integer equal to or more than two) which are serially connected to each other. A first edge delay cell 121_1 of M edge delay cells 121_1 to 121_M may receive the internal clock signal CK_INT, and M edge delay cells 121_1 to 121_M may output M edge detection signals E_DET[1] to E_DET[M]. In some embodiments, each of M edge delay cells 121_1 to 121_M may transfer an edge detection signal generated thereby to an edge delay cell subsequent thereto, and in some embodiments, each of M edge delay cells 121_1 to 121_M may transfer a signal, obtained by delaying an edge detection signal generated thereby, to an edge delay cell subsequent thereto. Therefore, as shown in FIG. 4, the edge detection signals E_DET may include M signals each having or exhibiting an edge or transition at a different time than the others. In some embodiments, M edge delay cells 121_1 to 121_M may have the same structure as each other, and in other embodiments two or more of M edge delay cells 121_1 to 121_M may have different structures than each other.

Referring to FIG. 4, the edge detection signal E_DET[M] which is an output of a last edge delay cell 121_M of M edge delay cells 121_1 to 121_M may have an edge delayed by "D_TOT" from an edge of the internal clock signal CK_INT. That is, a total delay time of M edge delay cells 121_1 to 121_M of FIG. 3 may be "D_TOT". As shown in FIG. 4, if "D_TOT" is greater than "T_I", the number of rising edges of the M edge detection signals E_DET[1] to E_DET[M] occurring in a period "T_I" of the internal clock signal CK_INT may be M and may be constant, and even when a delay time of each of M edge delay cells 121_1 to 121_M is changed or a variation of the PVT occurs due to noise, the number of rising edges may be maintained as M. Based on such a characteristic, a length of a time interval "Δt" which is shorter or longer than the period "T_I" of the internal clock signal CK_INT may be measured by counting the number of rising edges of M edge delay cells 121_1 to 121_M which occur during the time interval "Δt". In this manner, a circuit for converting a time interval into a digital value may be referred to as a time-to-digital converter (TDC), and a circuit which converts a time interval into a digital value by using edge detection signals having different delays as shown in FIGS. 3 and 4 may be referred to as a stochastic TDC.

Each of M edge delay cells 121_1 to 121_M illustrated in FIG. 3 may detect an edge of an input signal to generate an edge detection signal and may provide a subsequent edge delay cell with the edge detection signal or a signal obtained by delaying the edge detection signal. In this manner, without loss, the edge detection signals E_DET may be generated by delaying the edge of the internal clock signal CK_INT, instead of the internal clock signal CK_INT. For example, when the internal clock signal CK_INT is delayed by a delay cell, there is a mismatch between a rising time and a falling time of a clock signal obtained through the delay and a mismatch between a rising edge response characteristic and a falling edge response characteristic of the delay cell, and for this reason, due to the mismatch between the rising time and the falling time, a duty ratio, and the mismatch between the rising edge response characteristic and the falling edge response characteristic, a plurality of clock signals obtained through delays have an error or are not normally generated. By delaying the edge of the internal clock signal CK_INT, such problems are solved, and as a length of edge delay chain 120' (i.e., the number of edge delay cells 121_1 to 121_M included in edge delay chain 120') increases, the number (i.e., M) of edges included in the period "T_I" of the internal clock signal CK_INT in FIG. 4 may increase, whereby an accuracy (or a resolution) of jitter measurement is more enhanced. An example of an edge delay cell will be described below with reference to FIGS. 5, 6A, and 6B.

Figure 5:
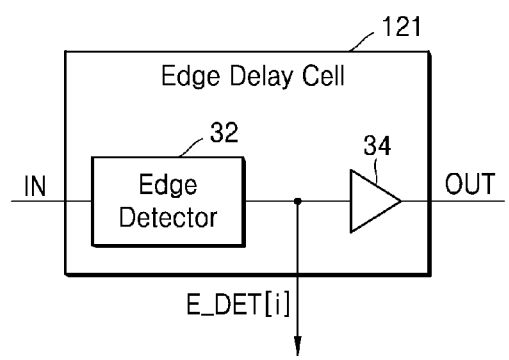
FIG. 5 is a block diagram illustrating an example embodiment of an edge delay cell included in the edge delay chain of FIG. 3.

FIG. 5 is a block diagram illustrating an example embodiment of an edge delay cell 121 included in edge delay chain 120' of FIG. 3. As described above with reference to FIG. 3, edge delay cell 121 of FIG. 5 may detect an edge of an input signal IN to generate an edge detection signal E_DET[i] and may output the edge detection signal E_DET[i] or an output signal OUT obtained by delaying the edge detection signal E_DET[i]. FIG. 5 illustrates an example of an edge delay cell which generates the output signal OUT obtained by delaying the edge detection signal E_DET[i].

Referring to FIG. 5, edge delay cell 121 may include an edge detector 32 and a delay unit 34. Edge detector 32 may detect an edge (for example, a rising edge or a falling edge) of an input signal to generate the edge detection signal E_DET[i] having a certain active pulse width. Due to the detected edge, a time when an active pulse of the edge detection signal E_DET[i] is generated may be delayed due to the detected edge.

Delay unit 34 may delay the edge detection signal E_DET[i] to generate the output signal OUT. Delay unit 34 may be implemented in various ways, and for example, may include an inverter, or two or more serially connected inverters. Referring again to FIG. 4, in order for the delay time D_TOT to be longer than the period T_I of the internal clock signal CK_INT, whether delay unit 34 is provided or not, and a delay of delay unit 34, may be determined based on a delay from the edge of the input signal IN to the edge detection signal E_DET[i] and the number M of edge delay cells included in an edge delay chain (for example, edge delay chain 120' of FIG. 3).

Figure 6A:
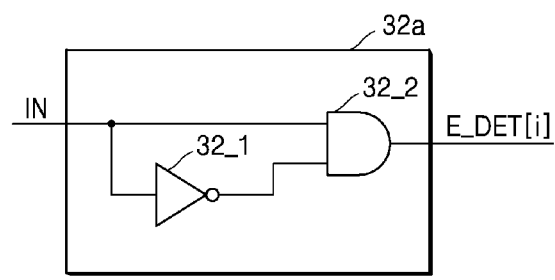
FIGS. 6A and 6B are block diagrams illustrating example embodiments of an edge detector of FIG. 5.
Figure 6B:
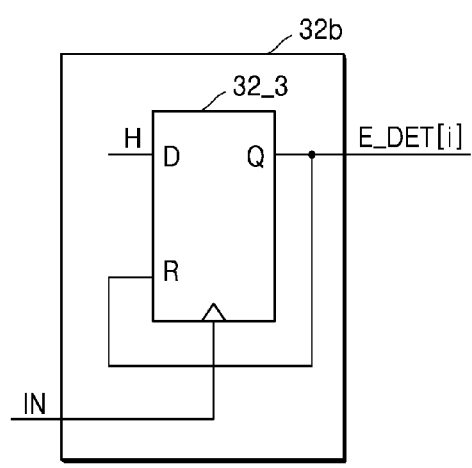

FIGS. 6A and 6B are block diagrams illustrating example embodiments of edge detector 32 of FIG. 5. In detail, FIGS. 6A and 6B illustrate exemplary edge detectors 32a and 33b for detecting a rising edge of an input signal IN, and it may be understood that example embodiments are not limited to edge detectors 32a and 33b.

Referring to FIG. 6A, edge detector 32a may include an inverter 32_1 and an AND gate 32_2. Therefore, if all of the input signal IN and an output signal of inverter 32_1 have a logic high level, an edge detection signal E_DET[i] may have a logic high level. As a result, in FIG. 6A, an active pulse width of the edge detection signal E_DET[i] may correspond to a delay time of inverter 32_1.

Referring to FIG. 6B, an edge detector 32b may include a flip-flop 32_3. As illustrated in FIG. 6B, a logic high level H may be applied to a data input terminal D of flip-flop 32_3, and an input signal may be applied to a clock input terminal of flip-flop 32_3. Also, a data output terminal Q of flip-flop 32_3 may be connected to a reset input terminal R. Therefore, if flip-flop 32_3 is a positive edge flip-flop, an edge detection signal E_DET[i] having a certain active pulse width may be generated in response to a rising edge of the input signal IN. As a result, in FIG. 6B, the active pulse width of the edge detection signal E_DET[i] may be determined based on a delay time from the reset input terminal to the data output terminal Q.

Figure 7:
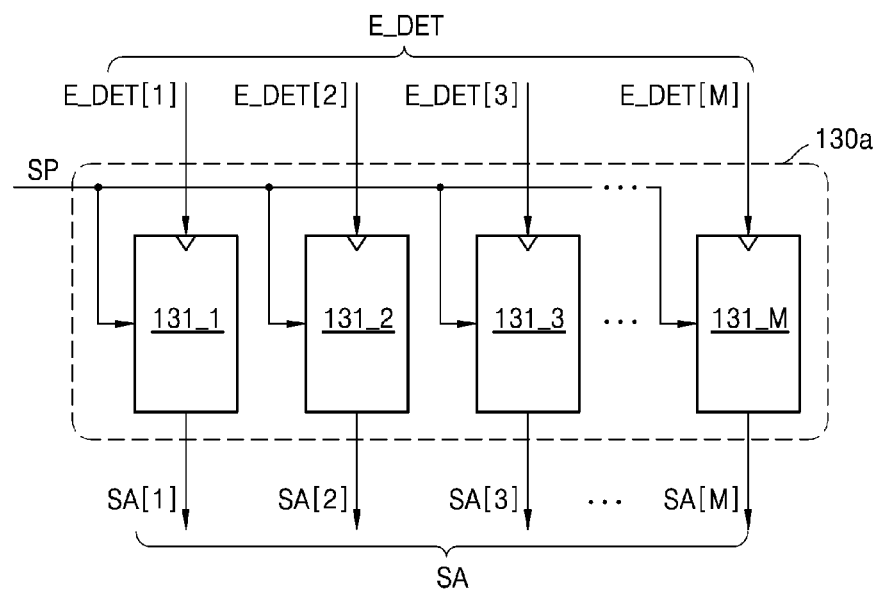
FIG. 7 is a block diagram illustrating an example embodiment of a latch block of FIG. 1.
Figure 8:
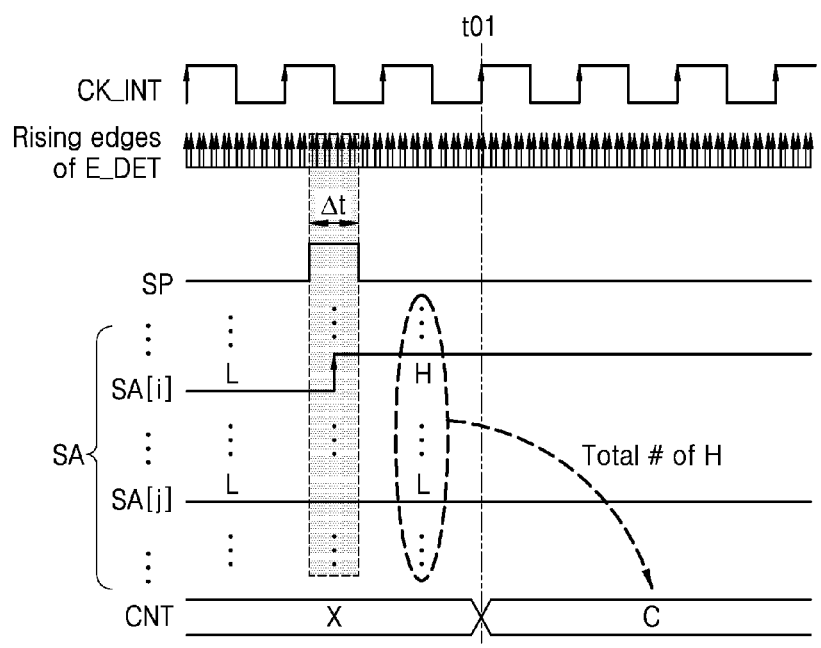
FIG. 8 is a timing diagram of sample signals which are output signals of a latch block, according to an example embodiment.

FIG. 7 is a block diagram illustrating an example embodiment of latch block 130 of FIG. 1, and FIG. 8 is a timing diagram of sample signals SA which are output signals of latch block 130, according to an example embodiment. As described above with reference to FIG. 1, a latch block 130a of FIG. 7 may receive the plurality of edge detection signals E_DET from edge delay chain 120 and may receive the single pule signal SP from internal signal generator 110, thereby outputting a plurality of sample signals SA. Hereinafter, the embodiment of FIGS. 7 and 8 will be described with reference to FIG. 1.

Referring to FIG. 7, latch block 130a may include M latch circuits 131_1 to 131_M. M latch circuits 131_1 to 131_M may respectively receive the M edge detection signals E_DET[1] to E_DET[M] from edge delay chain 120 of FIG. 3 and may receive the single pulse signal SP from internal signal generator 110 of FIG. 1 in common to respectively output M sample signals SA[1] to SA[M]. For example, a first latch circuit 131_1 may receive a first edge detection signal E_DET[1] and the single pulse signal SP and may latch the single pulse signal SP in synchronization with the first edge detection signal E_DET[1] to output a first sample signal SA[1].

In some embodiments, M latch circuits 131_1 to 131_M may each be a D flip-flop. For example, the single pulse signal SP may be applied to a data input terminal of the D flip-flop, clock input terminals of the D flip-flops may respectively receive the M edge detection signals E_DET[1] to E_DET[M], and data output terminals may respectively output the M sample signals SA[1] to SA[M].

Referring to FIG. 8, the single pulse signal SP may be activated during a time interval "Δt", and a latch circuit which receives an edge detection signal, having a rising edge during the time interval "Δt", of the M edge detection signals E_DET[1] to E_DET[M] may output an activated sample signal. For example, as illustrated in FIG. 8, one or more sample signals, for example sample signal SA[i], may be activated (i.e., shifted from an L level to an H level) based on an edge detection signal E_DET[i] having a rising edge during the time interval "Δt", and one or more other sample signals, for example sample signal SA[j], may be maintained in an inactive state (i.e., maintained at the L level), based on an edge detection signal E_DET[j] having no rising edge during the time interval "Δt". The single pulse signal SP may be activated, and then, count sub-circuit 140 of FIG. 1 may count the number of activated signals (i.e., signals having an H level) of the sample signals SA[1] to SA[M] to output a count signal CNT having a value "C" representing the number of sample signals activated at a time t01. Here, "C" may be proportional to the time interval "Δt". As described above with reference to FIG. 4, since "M" which is the number of the edge delay cells included in edge delay chain 120 corresponds to the period "T_I" of the internal clock signal CK_INT, the time interval "Δt" may be calculated from the value "C" as expressed in the following Equation (1):

$$\Delta t = T\_I * C / M \quad (1)$$

Figure 9:
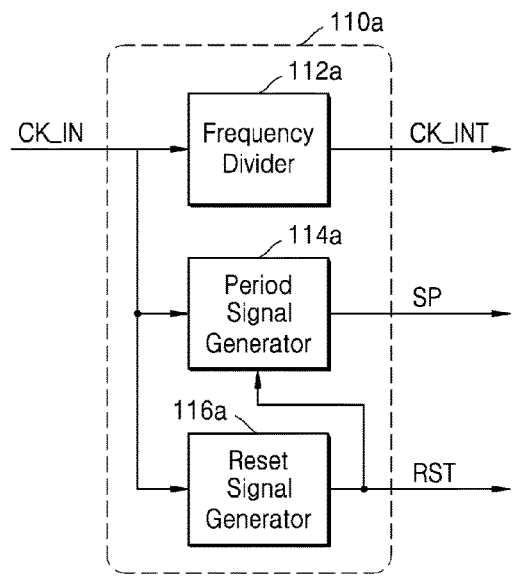
FIG. 9 is a block diagram illustrating an example embodiment of an internal signal generator of FIG. 1.

FIG. 9 is a block diagram illustrating an example embodiment of internal signal generator 110 of FIG. 1. As described above with reference to FIG. 1, an internal signal generator 110a of FIG. 9 may receive an input clock signal CK_IN to generate a single pulse signal SP and an internal clock signal CK_INT synchronized with the input clock signal CK_IN. Referring to FIG. 9, internal signal generator 110a may include a frequency divider 112a, a period signal generator 114a, and a reset signal generator 116a.

Frequency divider 112a may divide the frequency of the input clock signal CK_IN to generate the internal clock signal CK_INT. In some embodiments, frequency divider 112a may divide the frequency of the input clock signal CK_IN by two to generate the internal clock signal CK_INT having a period which is two times a period of the input clock signal CK_IN. In order to divide the frequency of the input clock signal CK_IN by two, for example, frequency divider 112a may include a flip-flop which receives the input clock signal CK_IN and have a data input and a data output connected to an inverter. Also, in order to divide the frequency of the input clock signal CK_IN by four, frequency divider 112a may include two flip-flops which receive the input clock signal CK_IN and are serially connected to each other, and may include an inverter which connects a data input of a first flip-flop to a data output of a second flip-flop.

In addition, it may be understood that frequency divider 112a may be variously implemented.

In some embodiments, a frequency of the internal clock signal CK_INT may be the same as a frequency of the input clock signal CK_IN, and frequency divider 112a may function as a clock buffer. A division ratio of frequency divider 112a may be determined based on the frequency of the input clock signal CK_IN. For example, if the input clock signal CK_IN has a relatively high frequency, for example, if a period of the input clock signal CK_IN is less than or similar to a delay time of an edge delay cell included in edge delay chain 120, frequency divider 112a may have a high division ratio so that a period of the internal clock signal CK_INT input to edge delay chain 120 is greater than the delay time of the edge delay cell included in edge delay chain 120. The internal clock signal CK_INT generated by frequency divider 112a may be synchronized with the input clock signal CK_IN. That is, a time interval between a rising edge of the internal clock signal CK_INT and a rising edge of the input clock signal CK_IN may be constant.

Period signal generator 114a may generate the single pulse signal SP having an active pulse width proportional to the period of the input clock signal CK_IN. In some embodiments, the single pulse signal SP may have a periodically activated pulse. In some embodiments, period signal generator 114a may generate the single pulse signal SP having an active pulse width matching the period of the input clock signal CK_IN. In some embodiments, period signal generator 114a may generate the single pulse signal SP having an active pulse width matching two times the period of the input clock signal CK_IN. For example, period signal generator 114a may include a toggle flip-flop which receives the input clock signal CK_IN. As described above, the active pulse width of the single pulse signal SP may be proportional to a value represented by the count signal CNT, and thus, the active pulse width of the single pulse signal SP may be calculated based on the value represented by the count signal CNT.

The single pulse signal SP generated by period signal generator 114a may be synchronized with the input clock signal CK_IN. That is, a time interval between a rising edge of the single pulse signal SP and a rising edge of the input clock signal CK_IN may be constant, and a time interval between a falling edge of the single pulse signal SP and a rising edge of the input clock signal CK_IN may be constant. The single pulse signal SP as well as the internal clock signal CK_INT may be synchronized with the input clock signal CK_IN, and thus, a jitter of the input clock signal CK_IN may be measured without using a separate reference signal (for example, a reference clock signal). Therefore, clock jitter measurement circuit 100 of FIG. 1 may be easily implemented, and thus, may be applied to various applications and circuits.

Reset signal generator 116a may generate a reset signal RST which is periodically activated and deactivated. The active pulse width of the single pulse signal SP may be measured, and the reset signal RST may be activated and then deactivated for measuring the active pulse width of the single pulse signal SP based on the period of the input clock signal CK_IN. For example, reset signal generator 116a may be implemented with a counter which receives the input clock signal CK_IN, or may be implemented with a state machine. As illustrated in FIG. 9, period signal generator 114a may receive the reset signal RST and may generate the single pulse signal SP having an active pulse in response to the reset signal RST. Also, latch block 130 and count sub-circuit 140 of FIG. 1 may receive the reset signal RST and may perform an operation of measuring the active pulse width of the single pulse signal SP in response to the reset signal RST. FIG. 9 illustrates an example where reset signal generator 116a receives the input clock signal CK_IN to generate the reset signal RST synchronized with the input clock signal CK_IN, but the present embodiment is not limited thereto. In other embodiments, reset signal generator 116a may receive the internal clock signal CK_INT to generate the reset signal RST synchronized with the internal clock signal CK_INT.

Figure 10:
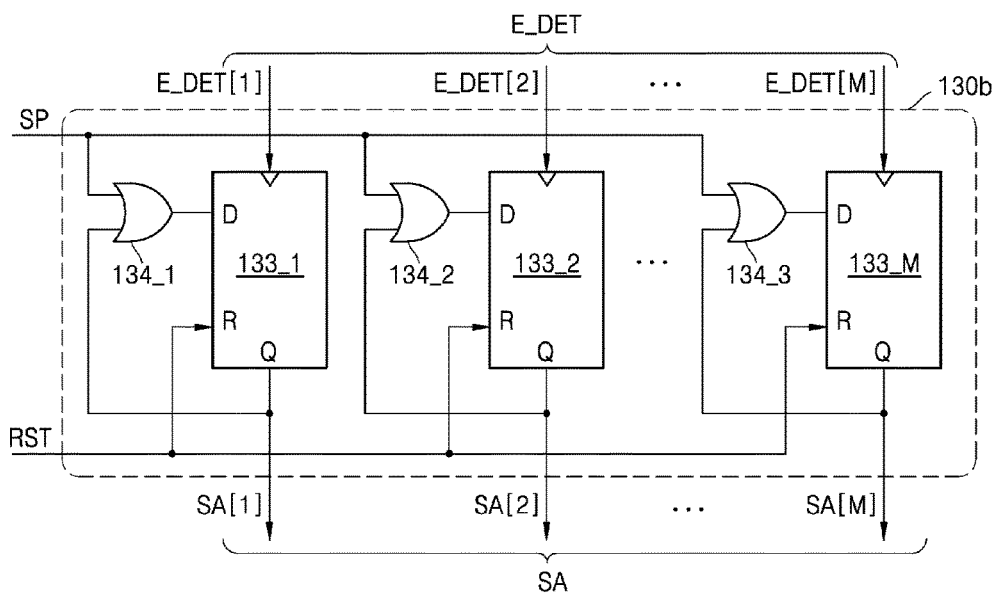
FIG. 10 is a block diagram illustrating another example embodiment of the latch block of FIG. 1.

FIG. 10 is a block diagram illustrating another example embodiment of latch block 130 of FIG. 1. In comparison with latch block 130a of FIG. 7, a latch block 130b of FIG. 10 may receive a reset signal RST.

Referring to FIG. 10, latch block 130b of FIG. 10 may include M flip-flops 133_1 to 133_M and M OR gates 134_1 to 134_M. A pair of an OR gate and a flip-flop where an output terminal of the OR gate is connected to a data input terminal D of the flip-flop may be referred to as one latch circuit. M flip-flops 133_1 to 133_M may respectively receive M edge detection signals E_DET[1] to E_DET[M], receive the reset signal RST in common, and respectively output M sample signals SA[1] to SA[M].

The M OR gates 134_1 to 134_M may receive single pulse signal SP in common, respectively receive the M sample signals SA[1] to SA[M], and respectively provide the M flip-flops 133_1 to 133_M with output signals thereof. For example, a first OR gate 134_1 may include a first input terminal receiving the single pulse signal SP and a second input terminal connected to a data output terminal Q of a first flip-flop 133_1, and may include an output terminal connected to a data input terminal D of a first flip-flop 133_1. Therefore, first flip-flop 133_1 may output an activated first sample signal SA[1] through the data output terminal Q in response to the activated single pulse signal SP and a first edge detection signal E_DET[1]. Subsequently, even when the single pulse signal SP is deactivated, the data input terminal D may maintain an activated state (i.e., a logic high state) according to the activated first sample signal SA[1], and thus, the first sample signal SA[1] may maintain an active state. A count operation may be completed, and when the reset signal RST is activated (for example, by reset signal generator 116a of FIG. 9), the first sample signal SA[1] may be shifted to an inactive state, namely, a logic low state.

Figure 11A:
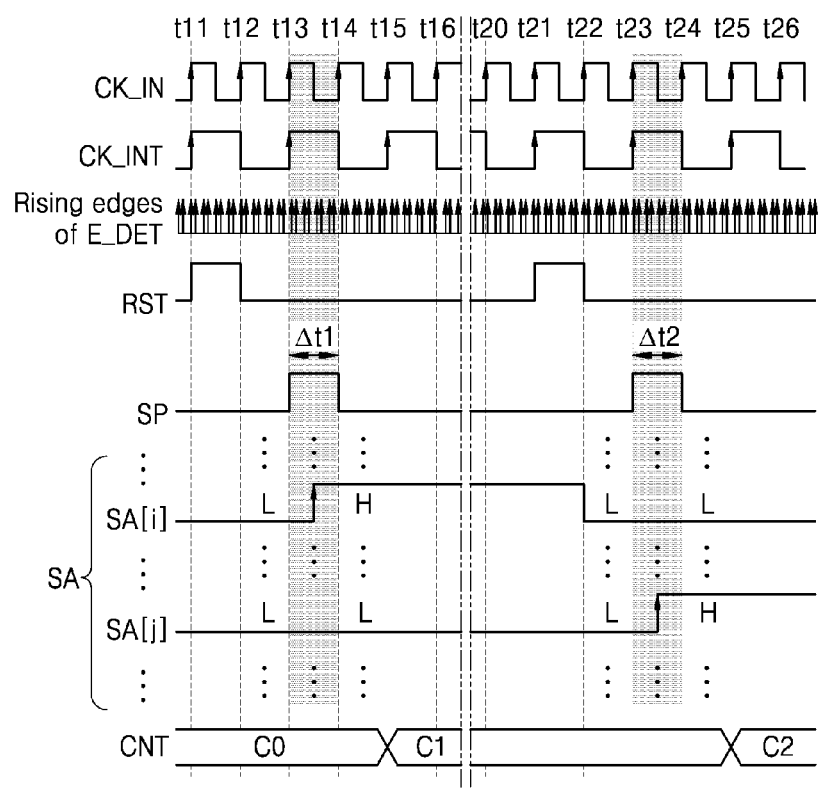
FIGS. 11A and 11B are timing diagrams showing output signals of the internal signal generator of FIG. 9, according to example embodiments.
Figure 11B:
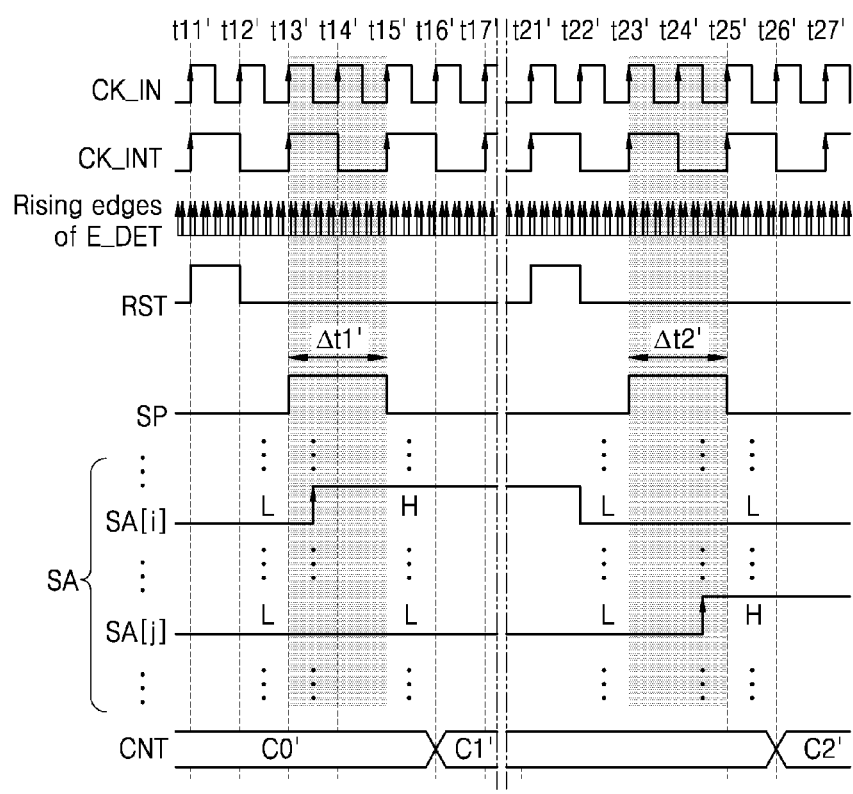

FIGS. 11A and 11B are timing diagrams showing output signals of internal signal generator 110a of FIG. 9 according to example embodiments. In detail, FIG. 11A shows an example where period signal generator 114a generates the single pulse signal SP having active pulse widths Δt1 and Δt2 matching a period of the input clock signal CK_IN, and FIG. 11B shows an example where period signal generator 114a generates the single pulse signal SP having active pulse widths Δt1' and Δt2' matching two times the period of the input clock signal CK_IN. FIGS. 11A and 11B show examples where a rising edge of the internal clock signal CK_INT and a rising edge of the input clock signal CK_IN occur at the same time, but the present embodiments are not limited thereto. Hereinafter, FIGS. 11A and 11B will be described with reference to FIG. 9.

Referring to FIG. 11A, the reset signal RST may be activated at a time t11, and at a time t12, the reset signal RST may be deactivated. In response to an active pulse of the reset signal RST, around a time t13, period signal generator 114a may generate the single pulse signal SP having an active pulse width Δt1 corresponding to a period of the input clock signal CK_IN, and the sample signals SA may be set to an inactive state (i.e., an L level).

Some of the sample signals SA may be activated (i.e., shifted from the L level to an H level) according to edge detection signals, having a rising edge during the active pulse width Δt1 of the single pulse signal SP, of the edge detection signals E_DET. Count sub-circuit 140 of FIG. 1 may count the number of activated sample signals of the sample signals SA to output the count signal CNT having a value "C1" at a time t15.

In order to again measure the period of the input clock signal CK_IN, the reset signal RST may be activated at a time t21, and at a time t22, the reset signal RST may be deactivated. At the time t22, the sample signal SA[i] may be deactivated (i.e., shifted to the L level) in response to the activated reset signal RST. Subsequently, similarly to the above description, the count signal CNT having a value "C2" corresponding to an active pulse width Δt2 of the single pulse signal SP may be output at a time t25.

Referring to FIG. 11B, period signal generator 114a may generate the single pulse signal SP which has active pulse widths Δt1' and Δt2' matching two times the period of the input clock signal CK_IN. In comparison with an example shown in FIG. 11A, since an active pulse width of the single pulse signal SP shown in FIG. 11B increases, the number of activated sample signals of the sample signals SA may be more than the example of FIG. 11A. Also, a value of the count signal CNT representing the number of activated sample signals of the sample signals SA may be output at a time which is more delayed than the example of FIG. 11A.

Figure 12:
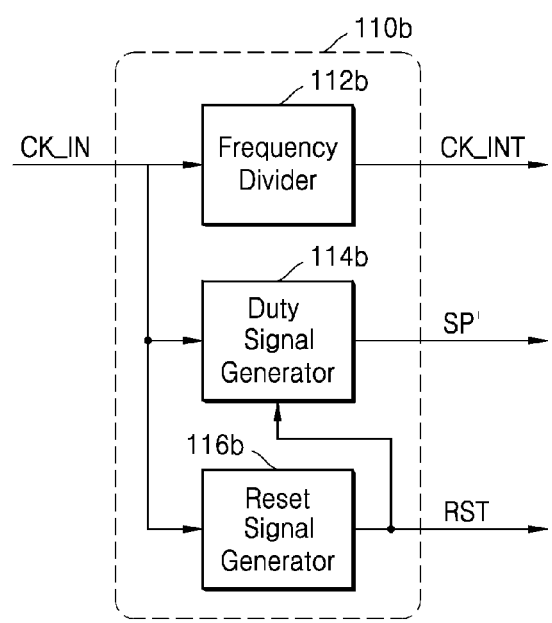
FIG. 12 is a block diagram illustrating another example embodiment of the internal signal generator of FIG. 1.
Figure 13:
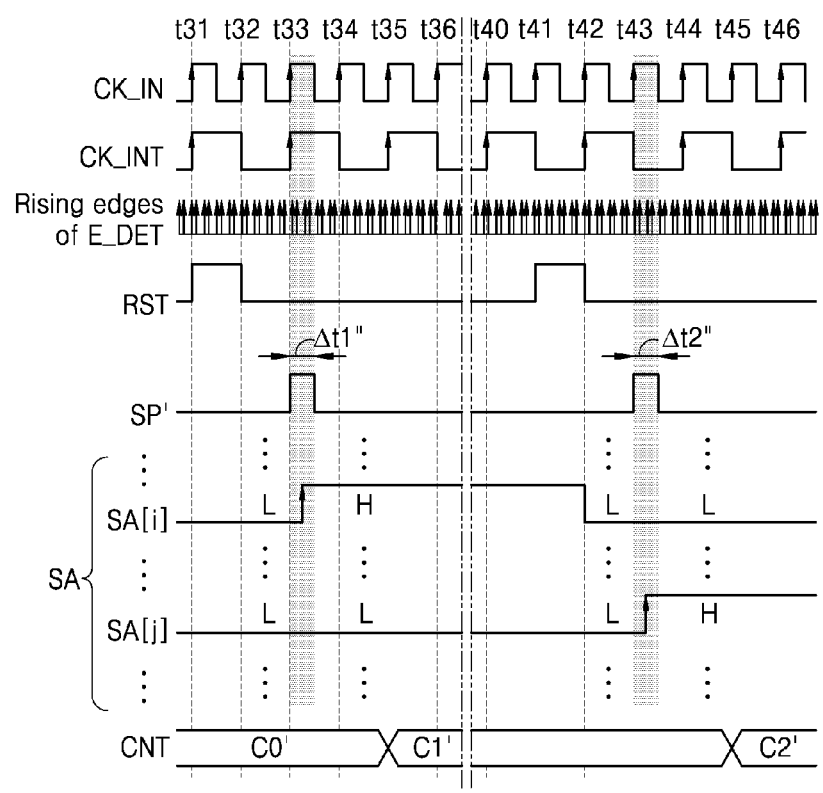
FIG. 13 is a timing diagram showing output signals of the internal signal generator of FIG. 12, according to example embodiments.

FIG. 12 is a block diagram illustrating another example embodiment of internal signal generator 110 of FIG. 1, and FIG. 13 is a timing diagram showing output signals of an internal signal generator 110b of FIG. 12 according to example embodiments. Referring to FIG. 12, internal signal generator 110b may include a frequency divider 112b, a duty signal generator 114b, and a reset signal generator 116b. In describing the elements of FIG. 12, description overlapping the description given above with reference to FIG. 9 may be omitted.

In some embodiments, clock jitter measurement circuit 100 of FIG. 1 may be used to measure a clock duty cycle, like a clock duty sensor, in addition to clock jitter measurement. That is, in order to measure a duty cycle of an input clock signal CK_IN, internal signal generator 110b may generate a single pulse signal SP' having an active pulse width corresponding to a positive pulse width or a negative pulse width of the input clock signal CK_IN. As described above with reference to FIG. 4, the number (for example, M) of rising edges of edge detection signals E_DET which are generated during a period of the input clock signal CK_IN may be substantially constant, and thus, the duty cycle of the input clock signal CK_IN may be measured by measuring a positive or negative pulse width of the input clock signal CK_IN, namely, by counting the number of rising edges of the edge detection signals E_DET which are generated during the positive or negative pulse width of the input clock signal CK_IN.

Referring to FIG. 13, the reset signal RST may be activated at a time t31, and at a time t32, the reset signal RST may be deactivated. In response to an active pulse of the reset signal RST, duty signal generator 114b may generate the single pulse signal SP' having an active pulse width Δt1" corresponding to the positive or negative pulse width of the input clock signal CK_IN around a time t33, and at the time t33, sample signals SA may be set to an inactive state (i.e., an L level).

Some of the sample signals SA may be activated (i.e., shifted from an L level to an H level) according to edge detection signals, having a rising edge during an active pulse width Δt1' of the single pulse signal SP', of the edge detection signals E_DET. The count signal CNT having a value "C1'" representing the number of activated sample signals of the sample signals SA may be output at a time t35. Similarly, an operation of measuring an active pulse width Δt2" of the single pulse signal SP' may be performed for a time t41 to a time t45, and at the time t45, the count signal CNT having a value "C2'" may be output.

Figure 14A:
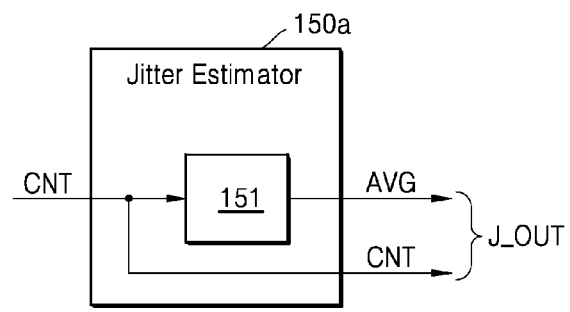
FIGS. 14A and 14B are block diagrams illustrating example embodiments of a jitter estimator of FIG. 1.
Figure 14B:
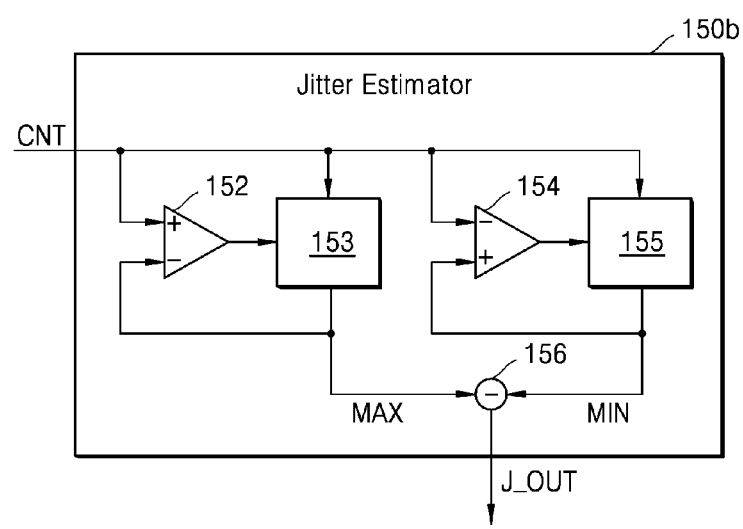

FIGS. 14A and 14B are block diagrams illustrating example embodiments of jitter estimator 150 of FIG. 1. As described above with reference to FIG. 1, a jitter estimator 150a of FIG. 14A and a jitter estimator 150b of FIG. 14B may generate a jitter output signal J_OUT including jitter information, based on a count signal CNT. Hereinafter, FIGS. 14A and 14B will be described with reference to FIG. 1.

Referring to FIG. 14A, jitter estimator 150a may include a register 151 which stores an average value of a plurality of values represented by the count signal CNT. As described above with reference to FIG. 4, the number "M" of edge delay cells may correspond to a period T_1 of an internal clock signal CK_INT, and if a variation of the period T_1 of the internal clock signal CK_INT is large, namely, if a jitter of the input clock signal CK_IN is high, an average period of the internal clock signal CK_INT may be considered for high reliability. To this end, jitter estimator 150a may include register 151 which stores an average of a plurality of values of the count signal CNT corresponding to a plurality of pulses of a single pulse signal SP, and the count signal CNT and a signal AVG representing the average stored in register 151 may each be output as the jitter output signal J_OUT. In some embodiments, unlike the illustration of FIG. 14A, jitter estimator 150a may output, as the jitter output signal J_OUT, a signal representing a ratio of a value of the count signal CNT corresponding to the average, instead of outputting the signal AVG representing the average stored in register 151. In some embodiments, an average of a plurality of values of the count signal CNT may be calculated from values obtained during a predetermined interval, and may be calculated as a moving average, based on a weighted sum.

Referring to FIG. 14B, jitter estimator 150b may extract a maximum value and a minimum value of a plurality of values of a count signal CNT and may calculate a difference between the maximum value and the minimum value. As illustrated in FIG. 14B, jitter estimator 150b may include first and second comparators 152 and 154, first and second registers 153 and 155, and a subtractor 156.

First register 153 may store the maximum value of the plurality of values of the count signal CNT. To this end, first comparator 152 may receive the count signal CNT and an output signal MAX of first register 153 and may compare a value of the count signal CNT with a value of the output signal MAX. If the value of the count signal CNT is greater than the value of the output signal MAX of first register 153, the value of the count signal CNT may be stored in first register 153 according to an activated output signal of first comparator 152. On the other hand, if the value of the count signal CNT is not greater than the value of the output signal MAX of first register 153, the value stored in first register 153 may be maintained according to a deactivated output signal of first comparator 152.

Similarly, second register 155 may store the minimum value of the plurality of values of the count signal CNT. To this end, second comparator 154 may receive the count signal CNT and an output signal MIN of second register 155 and may compare a value of the count signal CNT with a value of the output signal MIN. If the value of the count signal CNT is less than the value of the output signal MIN of second register 155, the value of the count signal CNT may be stored in second register 155 according to an activated output signal of second comparator 154. On the other hand, if the value of the count signal CNT is not less than the value of the output signal MIN of second register 155, the value stored in second register 155 may be maintained according to a deactivated output signal of second comparator 154.

The maximum value and the minimum value may be extracted from the plurality of values of the count signal CNT which are obtained during a predetermined interval. For example, first and second registers 153 and 155 may be reset after a predetermined time (for example, several milliseconds (ms) to several seconds (sec)) elapses, and in response to the reset, first register 153 may be set to zero, and second register 155 may be set to an upper limit of a storable value.

Subtractor 156 may receive the output signal MAX of first register 153 and the output signal MIN of second register 155 to generate a jitter output signal J_OUT corresponding to a difference between the maximum value and the minimum value. In some embodiments, subtractor 156 may be omitted, and jitter estimator 150b may also output the output signal MAX of first register 153 and the output signal MIN of second register 155.

Figure 15A:
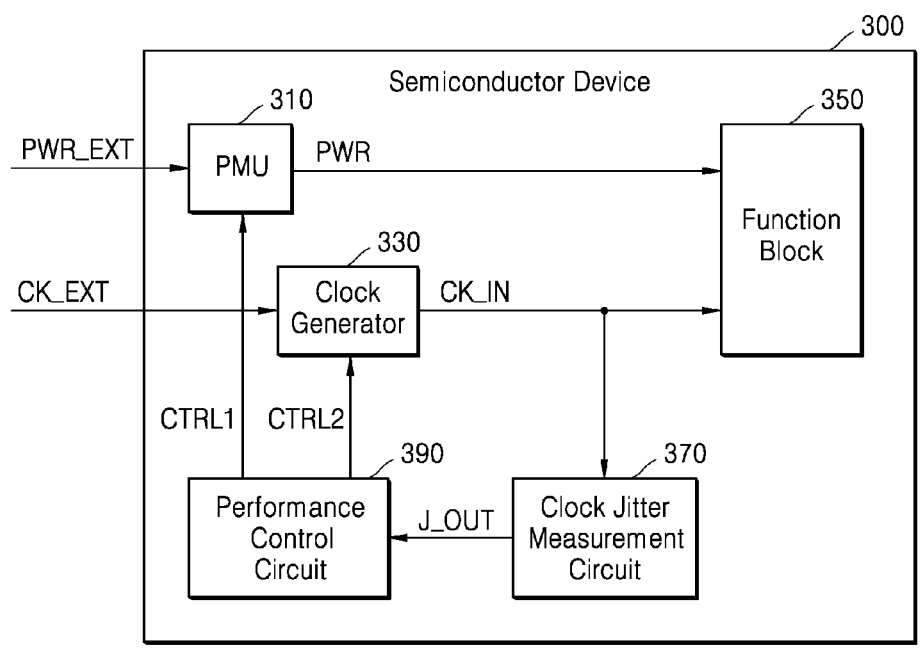
FIGS. 15A and 15B are block diagrams illustrating example embodiments of semiconductor devices each including a clock jitter measurement circuit.
Figure 15B:
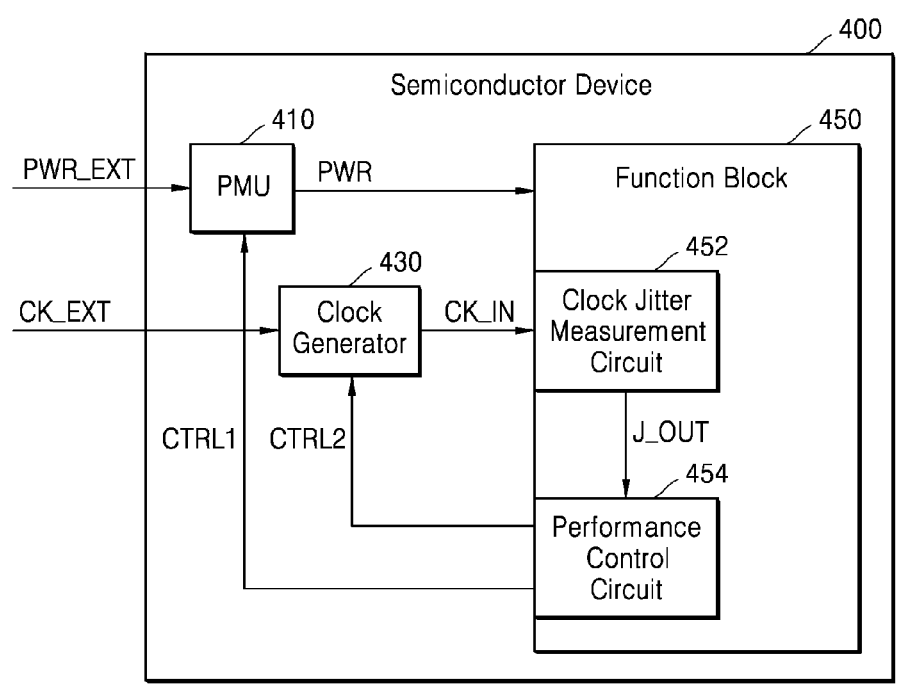

FIGS. 15A and 15B are block diagrams illustrating example embodiments of semiconductor devices 300 and 400 each including a clock jitter measurement circuit. As described above, the clock jitter measurement circuit according to an example embodiment may not include an analog element such as an amplifier, and thus, may be synthesized digitally. Accordingly, the clock jitter measurement circuit is easily modularized and is easily implemented in a semiconductor device including a digital circuit. The semiconductor device may adjust operation parameters so as to optimize performances of circuits (for example, function blocks 350 and 450 of FIGS. 15A and 15B) included in the semiconductor device, based on a clock jitter measured by the clock jitter measurement circuit. Hereinafter, in describing FIGS. 15A and 15B, overlapping descriptions are omitted.

In some embodiments, as illustrated in FIG. 15A, a clock jitter measurement circuit 370 may be disposed outside function block 350, but is not limited thereto. In some embodiments, as illustrated in FIG. 15B, a clock jitter measurement circuit 452 may be disposed in function block 450. Semiconductor device 300 of FIG. 15A and semiconductor device 400 of FIG. 15B, for example, may each be a processor including a core like an application processor (AP), a central processing unit (CPU), a graphic processing unit (GPU), etc., may be a memory device including flash memory, dynamic random access memory (DRAM), etc., or may be a system on chip (SoC) including a processor, an information provider (IP), a memory, etc.

Referring to FIG. 15A, semiconductor device 300 may include a power management unit (PMU) 310, a clock generator 330, function block 350, clock jitter measurement circuit 370, and a performance control circuit 390. PMU 310 may receive an external power PWR_EXT from the outside of semiconductor device 300 to supply power PWR to function block 350. PMU 310 may receive a first control signal CTRL1 from performance control circuit 390, and in response to the first control signal CTRL1, PMU 310 may adjust the power PWR supplied to function block 350. For example, in response to the first control signal CTRL1, PMU 310 may increase or decrease a voltage supplied to function block 350, or may cut off the supply of the voltage.

Clock generator 330 may receive an external clock signal CK_EXT from the outside of semiconductor device 300 to generate an input clock signal CK_IN and may supply the input clock signal CK_IN to function block 350. For example, clock generator 330 may include a phase locked loop (PLL). Clock generator 330 may receive a second control signal CTRL2 from performance control circuit 390, and in response to the second control signal CTRL2, clock generator 330 may adjust the input clock signal CK_IN supplied to function block 350. For example, in response to the second control signal CTRL2, clock generator 330 may increase or decrease a frequency of the input clock signal CK_IN supplied to function block 350, or may cut off the supply of the input clock signal CK_IN.

Function block 350 may include a circuit which operates in synchronization with the input clock signal CK_IN. For example, function block 350 may be a processor for executing instructions, or may be a logic circuit which is designed to perform a certain function. The performance of function block 350 may be determined based on the power PWR supplied from PMU 310 and the input clock signal CK_IN received from clock generator 330. For example, function block 350 may have high performance when the power PWR having a relatively high voltage and the input clock signal CK_IN having a high frequency are supplied thereto.

In some embodiments, function block 350 may include one or more circuits which operate in synchronization with the input clock signal CK_IN. For example, if semiconductor device 300 is a memory device, function block 350 may include peripheral circuits (for example, an address buffer, a decoder, a command decoder, and/or the like) for performing a write operation or a read operation.

Clock jitter measurement circuit 370 may receive the input clock signal CK_IN and may measure jitter of the input clock signal CK_IN to output a jitter output signal J_OUT. For example, clock jitter measurement circuit 370 may output, as the jitter output signal J_OUT, a count signal CNT and a signal AVG corresponding to an average period of the input clock signal CK_IN as illustrated in FIG. 14A, and as illustrated in FIG. 14B, clock jitter measurement circuit 370 may output a signal corresponding to a difference between a maximum value and a minimum value of a period of the input clock signal CK_IN during a predetermined period or may output a signal corresponding to the maximum value and a signal corresponding to the minimum value.

Performance control circuit 390 may determine the jitter of the input clock signal CK_IN, based on the jitter output signal J_OUT received from clock jitter measurement circuit 370. In some embodiments, performance control circuit 390 may "know" a priori the number (for example, "M" in FIG. 3) of edge delay cells included in clock jitter measurement circuit 370, and thus, may determine the jitter of the input clock signal CK_IN, based on a value represented by the jitter output signal J_OUT. In some embodiments, in a case where clock jitter measurement circuit 370 outputs a count signal CNT corresponding to a period of the input clock signal CK_IN as the jitter output signal J_OUT, the performance control circuit 390 may extract a maximum value and a minimum value from among a plurality of values of the jitter output signal J_OUT.

Performance control circuit 390 may control the performance of function block 350, based on the determined jitter of the input clock signal CK_IN. For example, when it is determined that the jitter of the input clock signal CK_IN is greater than a reference value, performance control circuit 390 may control PMU 310 by using the first control signal CTRL1 to lower a voltage of the power PWR supplied to function block 350, and/or may control clock generator 330 by using the second control signal CTRL2 to lower a frequency of the input clock signal CK_IN supplied to function block 350. On the other hand, when it is determined that the jitter of the input clock signal CK_IN is less than the reference value, performance control circuit 390 may control PMU 310 by using the first control signal CTRL1 to increase the voltage of the power PWR supplied to function block 350, and/or may control clock generator 330 by using the second control signal CTRL2 to increase the frequency of the input clock signal CK_IN supplied to function block 350. In some embodiments, performance control circuit 390 may include a lookup table and may generate the first and second control signals CTRL1 and CTRL2, based on the determined jitter of the input clock signal CK_IN and the lookup table.

Referring to FIG. 15B, semiconductor device 400 may include a PMU 410, a clock generator 430, and function block 450, and function block 450 may include a clock jitter measurement circuit 452 and a performance control circuit 454. In some embodiments, semiconductor device 400 may include a plurality of function blocks, and some of the plurality of function blocks may include a clock jitter measurement circuit and a performance control circuit as illustrated in FIG. 15B, whereby the performance of semiconductor device 400 may be controlled based on the determined jitter of an input clock signal CK_IN.

In FIGS. 15A and 15B, examples where each of performance control circuits 390 and 454 generates two control signals CTRL1 and CTRL2 are illustrated, but the present embodiments are not limited thereto. For example, performance control circuit 390 (454) may only generate a control signal for controlling one of PMU 310 (410) and clock generator 330 (430).

Figure 16:
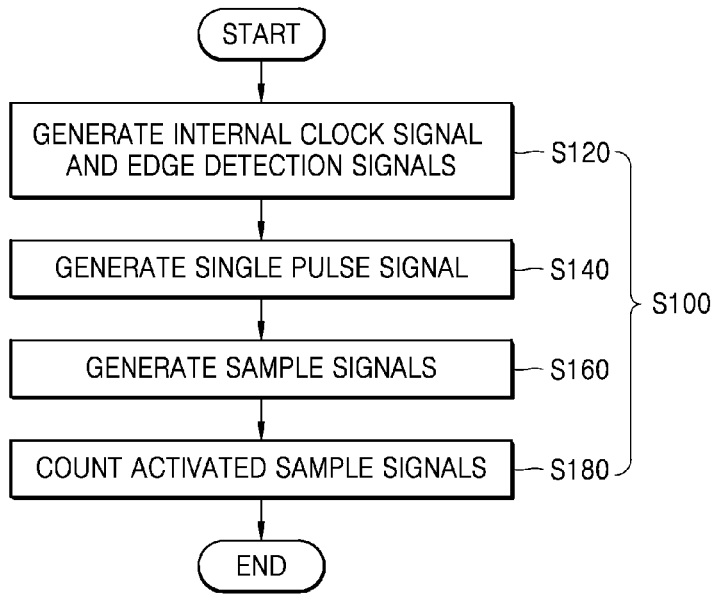
FIG. 16 is a flowchart illustrating an example embodiment of a clock jitter measurement method.

FIG. 16 is a flowchart illustrating an example embodiment of a clock jitter measurement method. In detail, FIG. 16 illustrates a method (S100) of outputting a count signal corresponding to a period of a clock signal. For example, a clock jitter measurement method (S100) of FIG. 16 may include operations S120, S140, S160, and S180 and may be performed by clock jitter measurement circuit 100 of FIG. 1. Hereinafter, FIG. 16 will be described with reference to FIG. 1.

Referring to FIG. 16, in operation S120, an operation of generating the internal clock signal CK_INT and the plurality of edge detection signals E_DET may be performed. The internal clock signal CK_INT may be a signal synchronized with the input clock signal CK_IN, and for example, may be generated by dividing the frequency of the input clock signal CK_IN. The internal clock signal CK_INT may have a frequency which is equal to or less than that of the input clock signal CK_IN. The internal clock signal CK_INT may pass through the serially connected plurality of edge delay cells included in edge delay chain 120, and thus, the plurality of edge detection signals E_DET may be generated. As described above with reference to FIG. 3, when the number of the serially connected edge delay cells is M, the number of rising edges of the edge detection signals E_DET occurring in a period of the internal clock signal CK_INT may be M and may be constant regardless of a variation of the PVT or a variation of a delay time of each of the edge delay cells caused by noise.

In operation S140, an operation of generating the single pulse signal SP may be performed. The single pulse signal SP may be synchronized with the input clock signal CK_IN, and an active pulse width of the single pulse signal SP may correspond to the period of the input clock signal CK_IN. For example, the active pulse width of the single pulse signal SP may match the period of the input clock signal CK_IN and may also be proportional to the period of the input clock signal CK_IN. Therefore, the period of the input clock signal CK_IN may be measured by measuring the active pulse width of the single pulse signal SP.

In operation S160, an operation of generating the sample signals SA may be performed. The latch block 130 may include a plurality of latch circuits respectively corresponding to the plurality of edge delay cells of edge delay chain 120, and the plurality of latch circuits may latch the single pulse signal SP in synchronization with the edge detection signals E_DET to generate the sample signals SA. That is, a latch circuit which receives an edge detection signal having a rising edge in the active pulse width of the single pulse signal SP may output an activated sample signal, and a latch circuit which receives an edge detection signal having no rising edge in the active pulse width of the single pulse signal SP may output a deactivated sample signal.

In operation S180, an operation of counting the number of activated sample signals may be performed. The number of activated sample signals of the sample signals SA which are generated in operation S160 may be proportional to the active pulse width of the single pulse signal SP, and thus, the count signal CNT corresponding to the active pulse width of the single pulse signal SP (i.e., a period of the input clock signal CK_IN) may be generated by counting the number of the activated sample signals. According to an example embodiment, as illustrated in FIGS. 15A and 15B, an operation (S170) may be performed in synchronization with the internal clock signal CK_INT during a plurality of continuous periods of the internal clock signal CK_INT.

Figure 17:
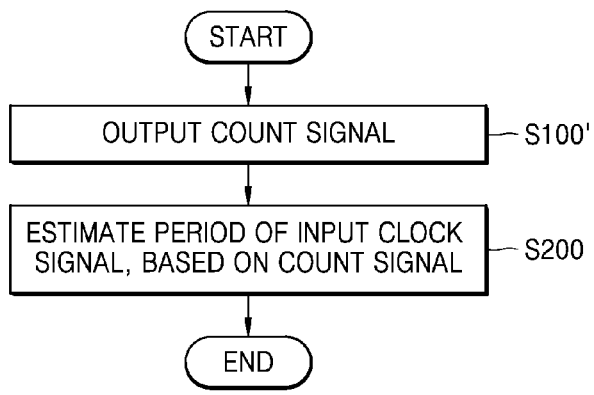
FIGS. 17 and 18 are flowcharts illustrating example embodiments of clock jitter measurement methods.
Figure 18:
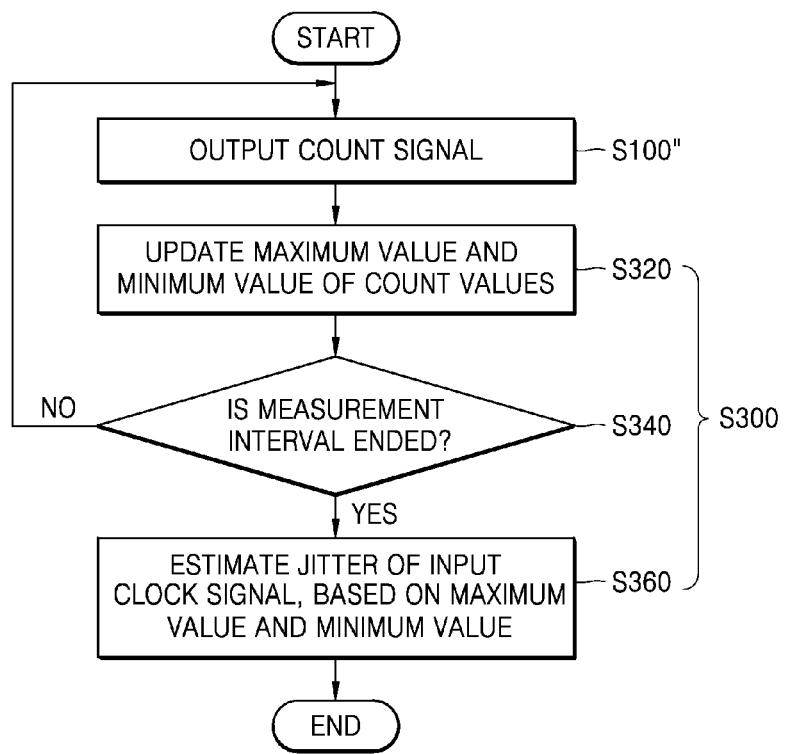

FIGS. 17 and 18 are flowcharts illustrating example embodiments of clock jitter measurement methods. In detail, FIG. 17 illustrates a method of estimating a period of an input clock signal, based on the count signal which is generated in the method (S100) of FIG. 16, and FIG. 18 illustrates a method of estimating jitter of an input clock signal, based on the count signal which is generated in the method (S100) of FIG. 16. Hereinafter, FIGS. 17 and 18 will be described with reference to FIG. 1.

Referring to FIG. 17, in operation S100', an operation of outputting the count signal CNT may be performed. For example, as described above with reference to FIG. 16, the plurality of edge detection signals E_DET may be generated from the internal clock signal CK_INT synchronized with the input clock signal CK_IN, and the count signal CNT may be generated from activated sample signals which are generated by latching the active pulse width of the single pulse signal SP synchronized with the input clock signal CK_IN according to the plurality of edge detection signals E_DET.

In operation S200, an operation of estimating a period of the input clock signal CK_IN based on the count signal CNT may be performed. As described above, edges corresponding to the number of edge delay cells may occur in one or more of the plurality of edge detection signals E_DET during a period of the internal clock signal CK_INT, and when the active pulse width of the single pulse signal SP corresponds to the period of the input clock signal CK_IN, the period of the input clock signal CK_IN may be estimated based on the number of edges represented by the count signal CNT. The jitter of the input clock signal CK_IN may be estimated based on a difference between the estimated period and a predetermined period.

Referring to FIG. 18, in operation S100", an operation of outputting the count signal CNT may be performed. For example, as described above with reference to FIG. 16, the plurality of edge detection signals E_DET may be generated from the internal clock signal CK_INT synchronized with the input clock signal CK_IN, and the count signal CNT may be generated from activated sample signals which are generated by latching the active pulse width of the single pulse signal SP synchronized with the input clock signal CK_IN according to the plurality of edge detection signals E_DET.

In operation S320, an operation of updating a maximum value and a minimum value of a plurality of count values may be performed. In order to measure jitter of the input clock signal CK_IN, a period of the input clock signal CK_IN may be measured a plurality of times, and during such a measurement interval, a maximum value and a minimum value when the measurement interval ends may be extracted by updating the maximum value and the minimum value of the count values represented by the count signal CNT which is output in operation S100".

In operation S340, an operation of determining whether the measurement interval ends may be performed. For example, in order to measure the period of the input clock signal CK_IN a plurality of times, the number of values obtained by measuring the period of the input clock signal CK_IN may be previously set, or an interval where the period of the input clock signal CK_IN is measured may be previously set. When the number of the values obtained by measuring the period of the input clock signal CK_IN does not reach a predetermined number or the interval where the period of the input clock signal CK_IN is measured does not end, an operation of outputting the count signal CNT may be performed in operation S100". On the other hand, when the number of the values obtained by measuring the period of the input clock signal CK_IN reaches a predetermined number or the interval where the period of the input clock signal CK_IN is measured ends, a maximum value and a minimum value may be determined.

In operation S360, an operation of estimating jitter of the input clock signal CK_IN based on the maximum value and the minimum value may be performed. A difference between the maximum value and the minimum value which are extracted in preceding operations may be proportional to the jitter of the input clock signal CK_IN, and thus, the jitter of the input clock signal CK_IN may be estimated by calculating the difference between the maximum value and the minimum value.

While the inventive concept has been particularly shown and described with reference to embodiments thereof, it will be understood that various changes in form and details may be made therein without departing from the spirit and scope of the following claims.

What is claimed is:

1. A clock jitter measurement circuit, comprising:
    an internal signal generator configured to generate a single pulse signal and an internal clock signal which are both synchronized with an input clock signal which is received by the internal signal generator;
    a plurality of edge delay cells configured to generate a plurality of edge detection signals respectively corresponding to a plurality of delay edges obtained by delaying an edge of the internal clock signal, the plurality of edge delay cells being serially connected to each other;
    a plurality of latch circuits configured to latch the single pulse signal in synchronization with the plurality of edge detection signals to output a plurality of sample signals; and
    a count sub-circuit configured to count a number of activated sample signals of the plurality of sample signals and output a count value based on a counted number of activated sample signals.

2. The clock jitter measurement circuit of claim 1, wherein the plurality of edge delay cells each comprise:
    an edge detector configured to generate an edge detection signal from a rising edge or a falling edge of an input signal, the edge detection signal being activated during a certain interval; and
    a delay unit configured to delay the edge detection signal and thereby generate an output signal.

3. The clock jitter measurement circuit of claim 2, wherein
    the edge detector comprises a flip-flop, and
    the flip-flop comprises:
        a clock terminal configured to receive the input signal;
        a data terminal configured to receive a logic high level;
        an output terminal configured to output the edge detection signal; and
        a reset terminal connected to the output terminal.

4. The clock jitter measurement circuit of claim 1, wherein
    the internal signal generator comprises a period signal generator configured to generate the single pulse signal having an active pulse width proportional to a period of the input clock signal, and
    the number of the activated sample signals counted by the count sub-circuit is proportional to a period of the input clock signal.

5. The clock jitter measurement circuit of claim 4, further comprising:
    a first register and a second register;
    a first comparator configured to compare the count value with a value stored in the first register; and
    a second comparator configured to compare the count value with a value stored in the second register,
    wherein:
        the first register is updated according to an output signal of the first comparator and stores a maximum value of values which are counted by the count sub-circuit during a certain interval,
        the second register is updated according to an output signal of the second comparator and stores a minimum value of the values which are counted by the count sub-circuit during the certain interval, and
        a difference between the maximum value and the minimum value is proportional to a jitter of the input clock signal.

6. The clock jitter measurement circuit of claim 1, wherein:
    the internal signal generator comprises a duty signal generator configured to generate the single pulse signal having an active pulse width proportional to a positive pulse width or a negative pulse width of the input clock signal, and
    a ratio of the number of the activated sample signals counted by the count sub-circuit to a number of the plurality of edge delay cells is proportional to a duty cycle of the input clock signal.

7. The clock jitter measurement circuit of claim 1, wherein the internal signal generator comprises a divider configured to generate the internal clock signal by dividing a frequency of the input clock signal.

8. The clock jitter measurement circuit of claim 1, wherein:
the plurality of latch circuits each comprise a flip-flop, and the flip-flop comprises:
a clock terminal configured to receive one of the plurality of edge detection signals;
a data terminal configured to receive the single pulse signal; and
an output terminal configured to output one of the plurality of sample signals.

9. The clock jitter measurement circuit of claim 1, wherein:
the plurality of latch circuits each comprise a flip-flop and an OR gate including a first input terminal and a second input terminal,
the single pulse signal is input to the first input terminal of the OR gate, and
the flip-flop comprises:
a clock terminal connected to the second input terminal of the OR gate and configured to receive one of the plurality of edge detection signals;
a data terminal configured to receive an output signal of the OR gate; and
an output terminal configured to output one of the plurality of sample signals.

10. The clock jitter measurement circuit of claim 1, wherein:
the plurality of latch circuits are configured to receive a reset signal for deactivating the plurality of sample signals, and
the internal signal generator is configured to generate the reset signal which is activated and then deactivated before the single pulse signal is activated.

11. The clock jitter measurement circuit of claim 1, wherein:
the plurality of edge delay cells comprises $2^N$ (where N is an integer larger than one) edge delay cells, and the plurality of latch circuits comprises $2^N$ latch circuits,
the plurality of sample signals comprise $2^N$ signals, and
the count sub-circuit is configured to count the activated sample signals of the plurality of sample signals and generate an N-bit output signal based on the counted number of activated sample signals.

12. The clock jitter measurement circuit of claim 1, wherein the clock jitter measurement circuit is an integrated circuit including a plurality of standard cells.

13. The clock jitter measurement circuit of claim 1, further comprising a jitter estimator configured to generate a jitter output signal including information about a jitter of the input clock signal, based on the count value.

14. A semiconductor device, comprising:
a function block including a logic circuit configured to receive an input clock signal and to operate in synchronization with the input clock signal;
a clock jitter measurement circuit configured to measure a jitter of the input clock signal, based on a value obtained by counting a plurality of delay edges during a single pulse synchronized with the input clock signal, the plurality of delay edges being obtained by delaying an edge of the input clock signal; and
a performance control circuit configured to control performance of the logic circuit, based on the measured jitter of the input clock signal.

15. The semiconductor device of claim 14, wherein the performance control circuit is configured to control the performance of the logic circuit by controlling at least one of a frequency of the input clock signal and a source voltage supplied to the logic circuit of the function block.

16. The semiconductor device of claim 14, wherein the clock jitter measurement circuit comprises:
an internal signal generator configured to generate a single pulse signal and an internal clock signal which are both synchronized with the input clock signal;
a plurality of edge delay cells configured to generate a plurality of edge detection signals respectively corresponding to the plurality of delay edges, the plurality of edge delay cells being serially connected to each other;
a plurality of latch circuits configured to latch the single pulse signal in synchronization with the plurality of edge detection signals to output a plurality of sample signals; and
a count sub-circuit configured to count a number of activated sample signals of the plurality of sample signals and output a count value based on a counted number of activated sample signals.

17. The semiconductor device of claim 16, wherein:
the plurality of latch circuits each comprise a flip-flop and an OR gate including a first input terminal and a second input terminal,
the single pulse signal is input to the first input terminal of the OR gate, and
the flip-flop comprises:
a clock terminal connected to the second input terminal of the OR gate and configured to receive one of the plurality of edge detection signals;
a data terminal configured to receive an output signal of the OR gate; and
an output terminal configured to output one of the plurality of sample signals.

18. A method, comprising:
generating a plurality of edge detection signals from an input clock signal, wherein the edge detection signals each detect an edge in an internal clock signal, which is synchronized to the input clock signal, at a corresponding point delayed in time with respect to the edge in the internal clock signal;
counting a number of the plurality of edge detection signals which exhibit a transition within a defined time interval which is proportional to a period of the input clock signal; and
estimating a jitter in the input clock signal from a result of the counting.

19. The method of claim 18, wherein counting the number of the plurality of edge detection signals which exhibit the transition within the defined time interval which is proportional to the period of the input clock signal further comprises:
latching a pulse signal, synchronized to the input clock signal, in synchronization with the plurality of edge detection signals to produce a plurality of sample signals; and
counting a number of the sample signals which are activated in response to the edge detection signals within the defined time interval.

20. The method of claim 18, further comprising:
obtaining a plurality of count values of the edge detection signals which exhibit the transition within each of a plurality of defined time intervals;
extracting a maximum value and a minimum value of the obtained plurality of count values; and estimating the jitter in the input clock signal, based on a difference between the maximum value and the minimum value.

\* \* \* \* \*